US012578365B2

(12) United States Patent
Beck

(10) Patent No.: US 12,578,365 B2
(45) Date of Patent: Mar. 17, 2026

(54) DEVICE AND METHOD FOR DETECTING A VOLTAGE DROP

(71) Applicant: Metabowerke GmbH, Nuertingen (DE)

(72) Inventor: Tobias Beck, Neuffen (DE)

(73) Assignee: Metabowerke GmbH, Nuertingen (DE)

( * ) Notice: Subject to any disclaimer, the term of this patent is extended or adjusted under 35 U.S.C. 154(b) by 125 days.

(21) Appl. No.: 18/263,547

(22) PCT Filed: Feb. 1, 2022

(86) PCT No.: PCT/EP2022/052316
§ 371 (c)(1),
(2) Date: Jul. 31, 2023

(87) PCT Pub. No.: WO2022/167405
PCT Pub. Date: Aug. 11, 2022

(65) Prior Publication Data
US 2024/0103048 A1 Mar. 28, 2024

(30) Foreign Application Priority Data
Feb. 2, 2021 (DE) .......................... 102021102304.1

(51) Int. Cl.
*G01R 19/165* (2006.01)
*B25F 5/00* (2006.01)
(Continued)

(52) U.S. Cl.
CPC .......... *G01R 19/16542* (2013.01); *B25F 5/00* (2013.01); *H02H 3/243* (2013.01); *H02H 11/007* (2013.01)

(58) Field of Classification Search
CPC ............. G01R 19/16542; H02H 3/243; H02H 11/007; B25F 5/00
See application file for complete search history.

(56) References Cited

U.S. PATENT DOCUMENTS

| | | | |
|---|---|---|---|
| 5,357,395 A | 10/1994 | Bissel et al. | |
| 2021/0384724 A1* | 12/2021 | Matheis | ............... H02H 11/007 |

FOREIGN PATENT DOCUMENTS

| | | |
|---|---|---|
| DE | 19645144 A1 | 5/1997 |
| DE | 10222175 A1 | 11/2003 |

(Continued)

OTHER PUBLICATIONS

Choulouilidou, Chrissanthi, "International Search Report and Written Opinion Re PCT/EP2022/052316", May 4, 2022, p. 16, Published in: EP.

*Primary Examiner* — Minh Q Phan
(74) *Attorney, Agent, or Firm* — NOD Law PC

(57) ABSTRACT
The invention relates to a device for detecting a voltage drop between an anode connection and a cathode connection, comprising: a control capacitor, of which the first electrode is connected to the anode connection and the second electrode is connected to the cathode connection; a measuring device, which is designed to output a discharge signal depending on a potential difference detected between the anode connection and the cathode connection and a first threshold value for the potential difference on a discharge control line; a discharge circuit which is connected to the discharge control line and is designed to discharge the control capacitor depending on the discharge signal; and a control device, which is designed to detect the voltage drop by evaluating the state of charge of the control capacitor.

10 Claims, 1 Drawing Sheet

(51) Int. Cl.
     *H02H 3/24*          (2006.01)
     *H02H 11/00*       (2006.01)

(56)           References Cited

FOREIGN PATENT DOCUMENTS

| | | | |
|---|---|---|---|
| DE | 102018127502 | A1 | 11/2018 |
| EP | 3306767 | A1 | 4/2018 |
| EP | 3441192 | A1 | 2/2019 |

* cited by examiner

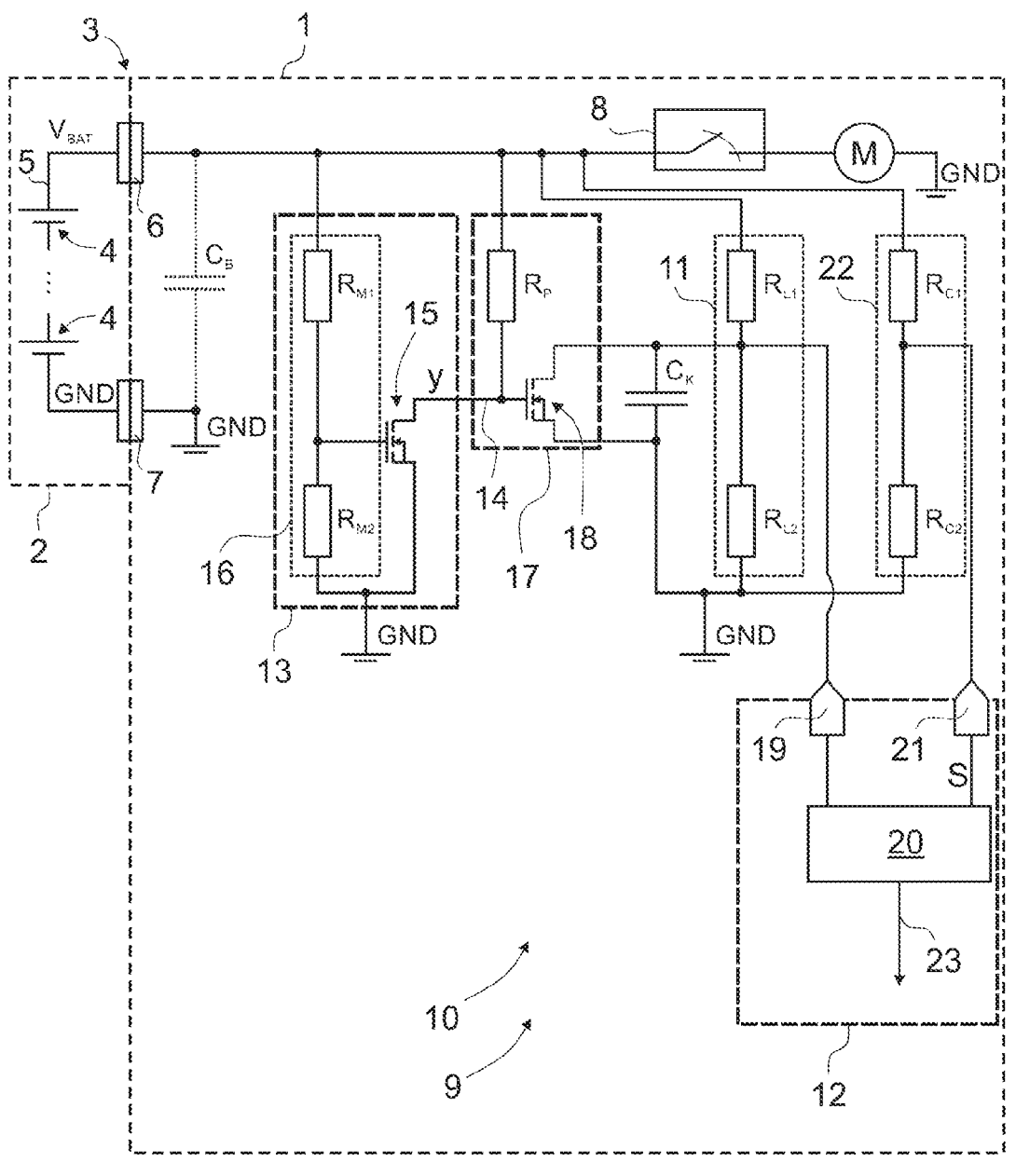

DEVICE AND METHOD FOR DETECTING A VOLTAGE DROP

CLAIM OF PRIORITY UNDER 35 U.S.C. 119

The present application is a National Stage Application of International Application No. PCT/EP2022/052316 filed on Feb. 1, 2022 which claims the benefit and priority of German patent application 10 2021 102 304.1 filed Feb. 2, 2021 the disclosure of which, by reference herein, are incorporated in their entirety.

TECHNICAL FIELD

The invention relates to a device for detecting a voltage drop between an anode connection and a cathode connection, the device including a control capacitor, a measuring device, a discharge circuit and a control device.

The invention also relates to an electrical machine tool, more particularly a battery-operated electrical machine tool, which includes a device for detecting a voltage drop.

The invention also relates to a method for detecting a voltage drop between an anode connection and a cathode connection, whereupon the state of charge of a control capacitor is evaluated in order to detect the voltage drop.

Moreover, the invention relates to a computer program for carrying out the method by means of a control device.

BACKGROUND

With respect to electrical devices, it is occasionally necessary to detect a voltage drop (more particularly a voltage drop of a supply voltage of the electrical device or of components of the electrical device) in order, for example, to initiate suitable measures for limiting damaging effects of the voltage drop and/or preventive measures for avoiding another voltage drop, or in order to document the voltage drop and/or inform a user about the incident.

The subsequent detection of a voltage drop, for example, after a supply voltage has been restored, is technically not always easy to achieve, more particularly since the electronic components of the device, which may be used to detect the voltage drop (for example, a control device, such as a microprocessor, etc.), are generally also affected by the voltage drop.

The detection of a voltage drop can be displayed for, among other things, safety-critical devices, such as, for example, alarm systems, hazard warning systems, and devices for access restriction, and more particularly also for motor-driven devices, such as, for example, electrically driven vehicles or electrical machine tools.

With respect to electrical machine tools and electrically driven vehicles, there is a particular risk that the electrical machine tool or the vehicle will be unintentionally set into motion after the voltage has been restored.

This can be the case, more particularly, with electrical machine tools when the manually actuatable operating switch of the electrical machine tool for switching the electrical machine tool on and off can be fixed in the switch-on position. In such cases, it may happen that the operating switch is in its switch-on position when the user connects the electrical machine tool to a voltage source. Alternatively, an unintentional start-up of an electrical machine tool can also take place when the supply voltage temporarily fails during the operation of the electrical machine tool due to a fault, for example, due to an overheated rechargeable battery pack, and is subsequently unexpectedly restored, for example, once the rechargeable battery pack has sufficiently cooled down.

The unintentional and, thereby, possibly also unsupervised start-up of the electrical machine tool or of an electric vehicle can be extremely dangerous to the user and also to other persons who are in the immediate vicinity, and can also cause costly damage to the machine or to the vehicle. In order to avoid the risks to the user and his/her surroundings that arise in this case, a monitoring of the voltage drop can be displayed in order to provide restart protection.

It is already known from the prior art to provide appropriate restart protection in electrical machine tools, more particularly in battery-operated electrical machine tools. In this approach, a safety system prevents electrical power from being applied at the motor when the operating switch of the electrical machine tool is actuated in its switch-on position upon connection of the electrical machine tool to the voltage source. An unintentional start-up of the electrical machine tool can be prevented as a result. Generally, a safety circuit is provided for this purpose, the safety circuit being connected to the operating switch of the electrical machine tool and ascertaining its switch position. The safety circuit also generally includes a monitoring circuit in order to ascertain, after a failure of the supply voltage, that the power to the electrical machine tool has been restored. Restart protection of this type ("starting inhibitor") for a battery-operated electrical machine tool is described, for example, in DE 10 2009 046 116 A1.

In practical application, buffer capacitors are used in electrical machine tools, more particularly also in battery-operated electrical machine tools, in order to minimize overvoltages, for example, during a clocking of an electrical machine tool having a brushless DC motor, such that all circuit-breakers of the electrical machine tool can be operated within their specified range. For this purpose, high-capacitive buffer capacitors having only very low equivalent series resistances ("low ESR" capacitors) are generally used at the rechargeable battery pack terminals and between the anode connection, which is provided for the electrical supply of the electrical machine tool, and the cathode connection. This is problematic, however, for the detection of a voltage drop or in combination with a restart protection device, since the buffer capacitors themselves can act as an energy source due to their high capacitance and their low series resistance. Due to the buffering of the supply voltage, removal of the rechargeable battery pack or a case of failure can therefore be obscured. Therefore, it may happen that the motor of the electrical machine tool initially fails after one or multiple rechargeable battery pack(s) is/are removed, but the restart protection device still receives sufficient voltage through the buffer capacitor, as a result of which it may not be obvious that the supply voltage has failed. Consequently, when the actual supply voltage is restored, the restart protection cannot be provided when the operating switch is actuated.

Moreover, the known devices for detecting a voltage drop occasionally cannot be reliably used when multiple rechargeable battery packs can be simultaneously inserted into the electrical machine tool. The known devices are also occasionally suitable only for use with certain types of rechargeable battery packs.

In light of the known prior art, the problem addressed by the present invention is to provide a device, with which a voltage drop can be reliably detected and which can be used, preferably in a flexible manner, in various electrical devices, more particularly also in combination with a buffered supply voltage and/or with multiple voltage sources.

Finally, the invention also addresses the problem of providing an electrical machine tool, into which an improved device for detecting a voltage drop has been integrated, more particularly for providing reliable restart protection.

Another problem addressed by the invention is to provide a method, with which a voltage drop can be reliably detected and which can be used, preferably in a flexible manner, in various electrical devices, more particularly also in combination with a buffered supply voltage and/or with multiple voltage sources.

One problem addressed by the invention is also that of providing an advantageous computer program.

The problem is solved for the device having the features described in claim 1. With respect to the electrical machine tool, the problem is solved by the features of claim 8. With respect to the method, the problem is solved by claim 10.

The dependent claims and the features described in the following relate to advantageous embodiments and variants of the invention.

A device for detecting a voltage drop is provided between an anode connection and a cathode connection.

The voltage or the potential difference between the anode connection and the cathode connection is also occasionally referred to in the following as "supply voltage." In principle, this does not necessarily need to be a supply voltage, however.

The anode connection can also be referred to as a "positive" connecting point. The cathode connection can also be referred to as a "negative" connecting point or as a "ground connection" or "ground."

The anode connection and/or the cathode connection can be understood to be part of the device according to the invention, although these can also be merely monitored by the device, i.e., not be part of the device.

According to the invention, the device includes a control capacitor, of which the first electrode is connected to the anode connection and the second electrode is connected to the cathode connection. The control capacitor can be any type of capacitor, in principle.

The device includes, according to the invention, a measuring device, which is designed to output a discharge signal depending on a potential difference, which is detected between the anode connection and the cathode connection, and a first threshold value for the potential difference on a discharge control line. Preferably, the measuring device is connected to the anode connection and/or the cathode connection for this purpose.

The potential difference between the anode connection and the cathode connection can be ascertained in the measuring device more particularly as a divider of the complete potential difference (preferably via the second voltage divider, which is also mentioned in the following).

According to the invention, the device also includes a discharge circuit, which is connected to the discharge control line and is designed to discharge the control capacitor depending on the discharge signal.

The discharge signal can be an analog voltage value or a digital voltage value, which is transmitted via the discharge control line. For example, the discharge signal can be a negative potential which is at least approximated to the potential of the cathode connection, or a positive potential which is at least approximated to the potential of the anode connection. The discharge signal can preferably be provided, however, due to the absence of an electrical potential on the discharge control line, for example, when the discharge control line is switched by the measuring device to zero potential ("floating"), while, in normal operation, i.e., given a sufficient potential difference between the anode connection and the cathode connection, a defined potential (more particularly a negative potential, for example, the potential of the cathode connection) is applied on the discharge control line.

According to the invention, the device also includes a control device which is designed to detect the voltage drop by evaluating the state of charge of the control capacitor.

The control device can be designed as a microprocessor. Instead of a microprocessor, any other device can be provided for implementing the control device, for example, one or multiple arrangement(s) of discrete electrical components on a printed circuit board, a programmable controller (SPS), an application specific integrated circuit (ASIC) or any other programmable circuit, for example, also a field programmable gate array (FPGA), a programmable logic array (PLA) and/or a commercially available computer.

One particular advantage of the invention is that the discharge signal is output by directly monitoring the potential difference between the anode connection and the cathode connection. As a result, for example, the need to monitor control lines of the voltage source providing the supply voltage can be dispensed with, as a result of which the device can be used in a flexible manner with any types of voltage sources.

Due to the fact that the measuring device refers to the first threshold value when generating the discharge signal, any residual voltages can also be advantageously considered due to a buffering of the voltage, for example, by a buffer capacitor, and, thereby, suppressed during the generation of the discharge signal.

It can be provided that, during the monitoring of the voltage drop by the control device, no absolute values are used for comparison. Rather, the comparison of the state of charge of the control capacitor is carried out with a divider of the supply voltage that is actually applied. In this way, the signal swing and the reliability of detection can be improved.

The control device can be designed to detect the voltage drop after the voltage has been restored, more particularly immediately or as soon as possible after the voltage has been restored.

In an advantageous development of the invention, it can be provided that the anode connection and/or the cathode connection are/is connectable to corresponding supply terminals of an external voltage source. These can be, more particularly, the supply terminals of one or multiple rechargeable battery pack(s).

For example, the anode connection and/or the cathode connection can directly be the anode contact or the cathode contact, respectively, of an appropriate supply interface, more particularly of a rechargeable battery pack interface.

The invention is particularly well suited for use with multiple rechargeable battery packs, for example, two, three, four or more rechargeable battery packs.

A rechargeable battery pack can be understood within the scope of the invention to mean an accumulator having a single accumulator cell (also referred to as a secondary cell) as well as an interconnected pack having multiple accumulator cells. A rechargeable battery pack can also be understood in the broadest sense to mean a store for electrical energy, which is not or not exclusively electrochemical, i.e., for example, a capacitor. Within the scope of the invention, batteries or battery packs, i.e., non-rechargeable stores for electrical energy, are also covered by the term "rechargeable battery pack."

According to one development of the invention, it can be provided that the first electrode of the control capacitor is connected to the anode connection via a first voltage divider.

Due to the fact that the control capacitor is connected to the anode connection and to the cathode connection, the control capacitor is charged when voltage is present between the anode connection and the cathode connection. During normal operation of the electrical device, it is finally to be assumed that the state of charge of the control capacitor remains constant or at least nearly constant after the first charging. This normal state can be detected by the control device. However, if the state of charge of the control capacitor deviates from this normal state, the control device can infer that a voltage drop has taken place.

In order to control the charging behavior of the control capacitor or to specify a defined charging curve, the control capacitor can be supplied with the voltage between the anode connection and the cathode connection in accordance with the division ratio of a first voltage divider. In this way, the charging duration and the maximum achievable charge voltage can be predefined.

The first voltage divider can, for example, be designed and dimensioned to provide the control capacitor with 1% to 50% of the potential difference between the anode connection and the cathode connection, preferably 2% to 40%, particularly preferably 3% to 30%, very particularly preferably 4% to 20%, still more preferably 5% to 10%.

For example, the first voltage divider of the first electrode of the control capacitor can provide a ratio of 27 to 497 of the potential difference between the anode connection and the cathode connection (more particularly at a nominal supply voltage of 36 volts). For example, the first voltage divider of the first electrode of the control capacitor can provide a ratio of 27 to 267 of the potential difference between the anode connection and the cathode connection (more particularly at a nominal supply voltage of 18 volts or 10.8 volts).

According to one development of the invention, it can be provided that the measuring device has a first controlled switch.

The control input of the first controlled switch can be connected to the anode connection via a second voltage divider. More particularly, in this way, the device is flexibly adaptable to various conditions, for example, also to an optionally present buffer capacitor.

The second voltage divider can, for example, be designed and dimensioned to provide the control input of the first controlled switch with 1% to 50% of the potential difference between the anode connection and the cathode connection, preferably 2% to 40%, particularly preferably 3% to 30%. For example, the second voltage divider can provide the control input of the first controlled switch with a ratio of 47 to 447 of the potential difference between the anode connection and the cathode connection. The aforementioned values are suitable, more particularly, at a nominal supply voltage of 36 volts.

The second voltage divider can, for example, also be designed and dimensioned to provide the control input of the first controlled switch with 4% to 20% of the potential difference between the anode connection and the cathode connection, or also 5% to 10%. For example, the second voltage divider can provide the control input of the first controlled switch with a ratio of 100 to 333 of the potential difference between the anode connection and the cathode connection. The aforementioned values are suitable, more particularly, at a nominal supply voltage of 18 volts or 10.8 volts.

The controlled switch can be designed to establish the first threshold value together with the first voltage divider.

In one development of the invention, it can be provided that the first threshold value is 10% to 90% of the nominal potential difference between the anode connection and the cathode connection, preferably 20% to 80% and particularly preferably 30% to 70%.

In one preferred variant, the first controlled switch can be designed to connect the discharge control line to the cathode connection with low impedance when the input potential applied at the control input exceeds the first threshold value. In principle, it is pointed out here that the first controlled switch can be designed to connect the discharge control line to the anode connection with low impedance when the input potential applied at the control input exceeds the first threshold value.

In one development of the invention it can be provided that the first controlled switch is designed to disconnect (or switch to high impedance) the discharge control line from the cathode connection when the input potential applied at the control input drops below the first threshold value.

Therefore, the discharge signal can preferably be generated by the discharge control line in normal operation, i.e., at a sufficient supply voltage, carrying the potential of the cathode connection or at least approximately carrying the potential of the cathode connection and, in the event of a voltage drop, is switched to zero potential. In principle, it can also be provided, however, that the discharge signal is provided on the discharge control line by means of a defined potential.

In one advantageous development of the invention, it can be provided that the discharge circuit has a second controlled switch.

The control input of the second controlled switch can be connected to the discharge control line. Preferably, the second controlled switch is designed to connect the first electrode of the control capacitor to the second electrode of the control capacitor with low impedance when the discharge signal is applied on the discharge control line, i.e., for example, when the discharge control line is disconnected from the cathode connection (more particularly when the discharge control circuit is potential-free).

It can be optionally provided that the discharge control line has a series resistance between the measuring device and the discharge circuit. The series resistance of the discharge control line can be, for example, 1 kΩ to 100 kΩ, for example, 47 kΩ.

In one development of the invention, it can be provided that the control input of the second controlled switch is connected to the anode connection via a pull-up resistor. Alternatively, a pull-down resistor can also be provided for the cathode connection.

Due to the pull-up resistor or the pull-down resistor, a discharge signal, which is based on a potential-free state, can be advantageously used. The pull-up resistor or the pull-down resistor can be, for example, 1 MΩ or higher, for example, 4.7 MΩ.

More particularly, it can be provided that the pull-up resistor or the pull-down resistor has higher impedance than the series resistance of the discharge control line. For example, the series resistance can be 4.7 kΩ and the pull-up resistor/pull-down resistor can be 4.7 MΩ.

In one advantageous development of the invention, it can be provided that the first controlled switch and/or the second controlled switch are/is designed as a semiconductor switch, more particularly as a MOSFET (Metal-Oxide-Semiconductor Field-Effect Transistor), preferably as an n-channel MOSFET. A p-channel MOSFET can also be provided as necessary.

In principle, however, any type of controlled switch can be provided, more particularly, however, a semiconductor switch. For example, it can also be provided that the controlled switch is in the form of a bipolar transistor. The type of the controlled switch is not limiting, in principle, for the present invention.

In one advantageous development of the invention, it can be provided that the control device has a comparator unit, which is designed to compare the state of charge of the control capacitor with a second threshold value for the potential difference between the anode connection and the cathode connection, wherein the voltage drop is detected when the state of charge is lower than the second threshold value.

The state of charge of the control capacitor can preferably be evaluated digitally. For example, the comparator unit can be in the form of a digital circuit or a digital software module.

The state of charge, more particularly the potential of the first electrode of the control capacitor, can be fed to the control device preferably via a first analog-to-digital converter.

The second threshold value can preferably be a relative potential difference in the manner of a divider of the actual supply voltage and can be fed to the control device, for example, via a second analog-to-digital converter, starting from a third voltage divider. The divider ratio of the third voltage divider preferably corresponds to the divider ratio of the first voltage divider.

In one advantageous development of the invention, it can be provided that the second threshold value is 1% to 95% of the nominal potential difference between the anode connection and the cathode connection, preferably 5% to 50%, for example, 5% to 10%.

The control device can be designed to detect the state of charge of the control capacitor immediately after a booting process or after start-up of the control device after sufficient supply voltage has been generated for the control device.

It can be provided that the control device is designed to monitor the state of charge of the control capacitor over a defined period of time. Therefore, the charging behavior of the control capacitor can also be detected and, for example, a charging process that is currently underway can be detected, which makes it possible to infer that a voltage loss has previously taken place.

The invention also relates to a electrical machine tool, more particularly a battery-operated electrical machine tool, having an anode connection and a cathode connection for electrical supply, and a device according to the preceding comments and the following comments for detecting a voltage drop between the anode connection and the cathode connection.

The provided device can be very particularly suited for use with an electrical machine tool. In principle, the device can be suited, however, for use with any type of electrical device in which it is advantageous to detect a voltage drop, more particularly also in an electrically driven vehicle.

In one development it can be provided that the device is in the form of a component of a restart protection device or has a restart protection device. The invention is particularly well suited for use with a restart protection device.

More particularly, it can be provided that the electrical machine tool has a restart protection device for protection against an uncontrolled restart of the electrical machine tool after a voltage drop, wherein the restart protection device is connected to the device for communication purposes or includes the device for the purpose of detecting the voltage drop.

Preferably, the electric motor of the electrical machine tool is in the form of a brushless DC motor (BLDC technology). The provided device for detecting the voltage drop is particularly well suited for this technology. If, for example, one or multiple rechargeable battery pack(s) is/are removed from the electrical machine tool, the voltage of the machine electronics system, with the BLDC technology, generally does not drop to 0 volts, since appropriate buffer capacitors are provided with, for example, up to 5 volts of residual charge. In order to nevertheless detect a restart protection event, it is possible due to the provided device to suppress the influence of the capacitor voltage.

The provided device is also advantageously suitable when a rechargeable battery pack is inserted at an angle or incorrectly or, for example, only one of multiple rechargeable battery packs is inserted into the electrical machine tool. The invention is therefore particularly well suited for, for example, battery-operated angle grinders, which are frequently operated by at least two series-connected rechargeable battery packs.

The electrical machine tool can have an operating switch for selectively switching the electric motor on or off. Optionally, the operating switch can be lockable in the switched-on and/or switched-off position.

The restart protection device can be designed to scan the operating switch and block a restart of the electric motor when the operating switch is actuated and immediately after a detected voltage drop once the voltage has been restored. Alternatively to scanning the operating switch, it can also be provided to detect the operating state of the electric motor prior to the voltage drop or establish whether the electric motor is about to restart or not once the supply voltage is restored.

The provided restart protection device can be particularly flexibly used for nearly all conceivable variants of electrical devices, more particularly electrical machine tools. The restart protection device can be, more particularly, designed to be more reliable than the known restart protection devices from the prior art.

The invention also relates to a method for detecting a voltage drop between an anode connection and a cathode connection, whereupon the state of charge of a control capacitor is evaluated in order to detect the voltage drop, the first electrode of the control capacitor being connected to the anode connection and the second electrode of the control capacitor being connected to the cathode connection. The control capacitor is discharged depending on a potential difference, which is detected between the anode connection and the cathode connection, and a first threshold value for the potential difference.

Advantageously, the control capacitor can be charged, for example, via a divider ratio of the supply voltage or the voltage between the anode connection and the cathode connection.

For example, an n-channel MOSFET or any type of transistor or controlled switch can be connected in parallel to the control capacitor in order to discharge the control capacitor in a controlled manner.

The control input or the gate terminal of the n-channel MOSFET can be connected to a first controlled switch coupled to rechargeable battery voltage or to an n-channel MOSFET of the measuring device. If the supply voltage is then disconnected, the first controlled switch of the measuring device finally becomes non-conductive and the second controlled switch is pulled in the direction of the anode connection, via a pull-up resistor, to a conductive potential, as a result of which the control capacitor is discharged despite the connected buffer capacitor, which itself can act as a supply source.

If, for example, a rechargeable battery pack is reinserted into a switched-on electrical device (restart protection event), i.e., with the electric motor of the electrical machine tool switched on, the second controlled switch is switched to being non-conductive again by means of its connection of the control input to the first controlled switch. The control capacitor is then able to recharge via an optional charging resistor to the defined divider ratio of the supply voltage. This charging behavior can be monitored by the control device and compared with a further divider ratio of the supply voltage. If the control capacitor is charged less than the provided complete charge, if necessary under consideration of certain tolerances, a voltage drop can be detected and, for example, an electric motor cannot be switched on.

The invention also relates to a computer program, including control commands, which, when the program is run by a control device, prompt the control device to carry out the method according to the preceding comments and the following comments.

The invention is also related to a use of a device according to the preceding comments and the following comments with an electrical device which has a buffer capacitor between the anode connection and the cathod connection, more particularly a high-capacitance buffer capacitor ("low ESR" capacitor).

The invention also relates to an advantageous use of a device according to the preceding comments and the following comments with an electrical device, more particularly an electrical machine tool, which can be operated by multiple voltage sources, more particularly by multiple rechargeable battery packs.

The invention is particularly suitable for use with an electrical device, for example, an electrical machine tool, with an external voltage supply for providing the voltage between the anode connection and the cathode connection.

It is pointed out here that an indirect or direct connection can be meant in any case in the preceding wording and the following wording, according to which electrical components are "connected" to other electrical components. Still further electrical components can therefore also be involved in the connection, if necessary, for example, resistors, coils, capacitors, or any other components. The term "connected" can also be exchangeable with the term "connected" as necessary within the sense of a direct electrical connection.

All resistors within the scope of the invention can also be composed, in principle, of appropriate resistor networks and, therefore, of multiple individual electrical resistors. This also applies similarly for all further electrical components, such as, for example, capacitors. The electrical interconnection of individual electrical components to form one larger common unit is routine to a person skilled in the art.

Features that have been described in conjunction with one of the subjects of the invention, namely given by the device, the electrical machine tool, the method and the computer program, are also advantageously usable for the other subjects of the invention. Similarly, advantages that have been mentioned in conjunction with one of the subjects of the invention can also be understood to relate to the other subjects of the invention.

In addition, it is pointed out the terms such as "having," "including," or "with" cannot rule out other features or steps. Moreover, terms such as "a/an" or "the", which refer to one step or feature, do not rule out a plurality of features or steps, and vice versa.

In a purist embodiment of the invention, it can also be provided, however, that the features introduced in the invention with the terms "having," "including," or "with" are exhaustively listed. Therefore, one or multiple listing(s) of features within the scope of the invention can be considered to be exhaustive, for example, considered for each claim. The invention can consist, for example, exclusively of the features mentioned in claim 1.

It is mentioned that identifiers such as "first" or "second," etc. are used primarily for reasons of distinction from particular device features or method features and are not to absolutely indicate that features are mutually dependent one another or are related.

Moreover, it is emphasized that the above-described values and parameters include deviations or fluctuations of ±10% or less, preferably ±5% or less, further preferably ±1% or less, and very particularly preferably ±0.1% or less than the particular mentioned value or parameter provided that these deviations are not ruled out when the invention is implemented in practical application. The description of ranges by means of starting values and end values also includes all the values and fractions that are included by the particular mentioned range, more particularly the starting values and end values and one particular mean.

BRIEF DESCRIPTION OF THE DRAWINGS

The following FIGURE shows a preferred exemplary embodiment of the invention, in which individual features of the present invention are shown in combination with one another. Features of the exemplary embodiment can also be implemented separately from one another and can therefore be readily connected by a person skilled in the are to form further reasonable combinations and subcombinations.

FIG. 1 shows a circuit diagram of a battery-operated electrical machine tool having a device for detecting a voltage drop within the scope of a restart protection device.

DETAILED DESCRIPTION OF PREFERRED EMBODIMENTS

FIG. 1 schematically shows a battery-operated electrical machine tool 1 and a rechargeable battery pack 2 which is connected to the electrical machine tool 1 for providing a supply voltage $V_{BAT}$ for the electrical machine tool 1.

The rechargeable battery pack 2 and the electrical machine tool 1 each have a rechargeable battery pack interface 3 for connecting the rechargeable battery pack 2 to the electrical machine tool 1. It is pointed out here that the invention can also be advantageously suitable for use with multiple rechargeable battery packs 2 in order to increase the provided supply voltage $V_{BAT}$ and/or to increase the operating time during the use of the electrical machine tool 1. Multiple rechargeable battery packs 2 can, more particularly, be connected in series, although in principle these can also be connected in parallel.

The rechargeable battery pack 2 can have one or multiple rechargeable battery cells 4, which are connected, for example, in series and, overall, generate the supply voltage $V_{BAT}$. The rechargeable battery pack 2 shown has, for example, a supply line 5 and a ground line GND, which are connected to the electrical machine tool 1 via the rechargeable battery pack interface 3 for supplying the electrical machine tool 1.

The electrical machine tool 1 shown has an anode connection 6 and a cathode connection 7 or GND, between which the supply voltage $V_{BAT}$ is applied. In order to compensate for overvoltages, a buffer capacitor $C_B$, more particularly an electrolyte capacitor, is provided between the anode connection 6 and the cathode connection 7. The buffer capacitor $C_B$ is not absolutely necessary within the scope of the invention, however; the invention is particularly advantageously suitable for use with an electrical machine tool 1 which has a buffer capacitor $C_B$ of this type.

Moreover, the electrical machine tool 1 has an operating switch 8 for selectively switching an electric motor M of the electrical machine tool 1 on or off. The operating switch 8 can be lockable in its switched-on position.

In order to prevent an undesirable restart of the electric motor M, for example, when the operating switch 8 is locked, after a voltage drop of the supply voltage $V_{BAT}$, a restart protection device 9 is provided, which includes the device 10 (described in the following) for detecting the voltage drop between the anode connection 6 and the cathode connection 7.

The device 10 for detecting the voltage drop has a control capacitor $C_K$, of which the first electrode is connected to the anode connection 6 and the second electrode is connected to the cathode connection 7. The control capacitor $C_K$ is therefore charged in the case of a rechargeable battery pack 2 being inserted into the electrical machine tool 1 and when supply voltage $V_{BAT}$ is present. In the exemplary embodiment, the charging of the control capacitor $C_K$ is delayed due to the use of an upstream primary charging resistor $R_{L1}$. The primary charging resistor $R_{L1}$ forms, with a secondary charging resistor $R_{L2}$, a first voltage divider 11 and, therefore, also limits the maximum achievable charging voltage of the control capacitor $C_K$. The primary charging resistor $R_{L1}$ can be dimensioned, for example, such that the control device 12 (described in the following) and/or further electrical components of the electrical machine tool 1 have sufficient time for a boot process in order to reliably detect a restart protection event. The use of a primary charging resistor $R_{L1}$ or of the first voltage divider 11 is optional, in principle.

The primary charging resistor $R_{L1}$ can be, for example, 470 kΩ and the secondary charging resistor can be 27 kΩ when the supply voltage $V_{BAT}$ is nominally 36 volts (for example, provided by two series-connected rechargeable battery packs 2). The primary charging resistor $R_{L1}$ can be, for example, 240 kΩ and the secondary charging resistor can be 27 kΩ when the supply voltage $V_{BAT}$ is nominally 18 volts or 10.8 volts (for example, provided by a single rechargeable battery pack 2).

The capacitance of the control capacitor $C_K$ can be, for example, 2 μF. Any type of design can be provided.

The provided device 10 includes a measuring device 13, which is designed to output a discharge signal y depending on a potential difference, which is detected between the anode connection 6 and the cathode connection 7, and a first threshold value for the potential difference on a discharge control line 14.

For this purpose, the measuring device 13 has a first controlled switch 15, which is in the form of an n-channel MOSFET in the exemplary embodiment. The control input or the gate terminal of the first switch 15 is connected to the anode connection 6 via a second voltage divider 16. The first switch 15 is designed to connect the discharge control line 14 to the cathode connection 7 with low impedance when the input potential applied at the control input exceeds the first threshold value. In the normal state, i.e., in the case of a sufficient voltage supply, the discharge control line 14 is therefore connected to the cathode connection 7 with low impedance. When the first threshold value is fallen below, i.e., in a case of a voltage drop of the supply voltage $V_{BAT}$, the discharge control line 14 is switched to zero potential, however, which corresponds to the discharge signal y in the exemplary embodiment.

The device can be flexibly configured by dimensioning the first switch 15 and the second voltage divider 16 and adapted, for example, for use with the buffer capacitor $C_B$. The first threshold value can be, for example, 10% to 90% of the nominal supply voltage $V_{BAT}$, preferably 20% to 80% and particularly preferably 30% to 70%. The divider ratio of the second voltage divider 16 can preferably be designed such that the first switch 15 switches the discharge control line 14 to be potential-free even prior to the maximum residual discharge (for example, 5 volts at a supply voltage $V_{BAT}$ of 36 volts or 4.3 volts at a supply voltage $V_{BAT}$ of 18 volts or 10.8 volts) of the buffer capacitor $C_B$, wherein, simultaneously, the permissible operating range of the electrical machine tool (for example, 30 volts to 42 volts at a supply voltage $V_{BAT}$ of 36 volts, 15 volts to 21 volts at a supply voltage of $V_{BAT}$ of 18 volts, or 9 volts to 12.6 volts at a supply voltage $V_{BAT}$ of 10.8 volts).

For example, the residual discharge of the buffer capacitor $C_B$ can be up to 4.3 volts at a nominal operating voltage of 10.8 volts or 18 volts. In this case, it can be provided that the switching of the first switch 15 begins at a detected potential difference of 9.33 volts downward and a complete disconnection of the discharge control line 14 from the cathode connection 7 has taken place, at the latest, at a residual potential of 5.73 volts. The primary resistor $R_{M1}$ of the second voltage divider 16, which is shown and is connected to the anode connection 6, can therefore be, for example, 2.33 MΩ, and the secondary resistor $R_{M2}$ of the second voltage divider 16, which is connected to the cathode connection 7, can be 1.0 MΩ.

According to one further example, the residual discharge of the buffer capacitor $C_B$ can be up to 5.0 volts at a nominal operating voltage of 36 volts. In this case, it can be provided that the switching of the first switch 15 begins at a detected potential difference of 26 volts downward, and a complete disconnection of the discharge control line 14 from the cathode connection 7 has taken place, at the latest, at a residual potential of 16 volts. The primary resistor $R_{M1}$ of the second voltage divider 16, which is shown and is connected to the anode connection 6, can therefore be, for example, 4.0 MΩ, and the secondary resistor $R_{M2}$ of the second voltage divider 16, which is connected to the cathode connection 7, can be 470 MΩ.

The provided device 10 also has a controllable discharge circuit 17, which is designed to discharge the control capacitor $C_K$. The discharge circuit 17 is connected to the discharge control line 14 for receiving the discharge signal y and is designed to discharge the control capacitor $C_K$ depending on the discharge signal y.

For example, it can be provided that the discharge circuit 17 establishes a high-impedance connection between the two electrodes of the control capacitor $C_K$ when a control input of the discharge circuit 17 is switched to the potential of the cathode connection 7 and otherwise establishes a low-impedance connection between the electrodes of the control capacitor $C_K$.

As is shown, the discharge circuit 17 can have a second controlled switch 18 for this purpose, namely one further n-channel MOSFET in the exemplary embodiment. The control input of the second switch 18 can be connected to the discharge control line 14, optionally via a series resistance (not shown) of, for example, 47 kΩ.

Provided that the discharge control line 14 is pulled by the measuring device 13 to the potential of the cathode connection 7 during normal operation, the second switch 18 has high impedance on the output side. On the other hand, if the discharge signal y is applied on the discharge control line 14, which is equivalent, in the exemplary embodiment, to a potential-free state of the discharge control line 14 on the part of the first switch 15, the control input of the second switch 18 is connected to the anode connection 6 via the pull-up resistor RP shown in FIG. 1. The pull-up resistor RP can be, for example, 4.7 MΩ.

In this way, the control capacitor $C_K$ is short-circuited by the discharge circuit 17 when the measuring device 13 detects a voltage drop of the supply voltage $V_{BAT}$. The control capacitor $C_K$ is therefore discharged. This takes place even when a buffer capacitor $C_B$ is present and, for the case in which multiple rechargeable battery packs 2 are present, also when only a portion of the rechargeable battery packs 2 is connected to the electrical machine tool 1.

Finally, the provided device 10 includes a control device 12, which is designed to detect the voltage drop by evaluating the state of charge of the control capacitor $C_K$. The control device 12 is preferably designed to be digital, for example, as a microcontroller of the electrical machine tool 1. An appropriately suitable computer program can be run on the control unit 12 with control commands that prompt the control device 12 to carry out the provided method.

In order to detect the state of charge by means of the control device 12, the first electrode of the control capacitor $C_K$, which, for example, is connected in the normal mode to the anode connection 6, is fed to the control device 12, more particularly via a first analog-to-digital converter 19.

The control device 12 can include a comparator unit 20, which is designed to compare the state of charge of the control capacitor $C_K$ with a second threshold value S for the potential difference between the anode connection 6 and the cathode connection 7. The voltage drop is preferably detected when the state of charge of the control capacitor $C_K$ is less than the second threshold value S, since it can then be assumed that the control capacitor $C_K$ has recently discharged.

The second threshold value S can be optionally fed to the control device 12 via a second analog-to-digital converter 21 and can result, for example, depending on the actual supply voltage $V_{BAT}$, as a divider ratio of the supply voltage $V_{BAT}$, for example, on the basis of a third voltage divider 22, in the ratio $R_{C1}$=470 kΩ to $R_{C2}$=27 kΩ (at a nominal supply voltage $V_{BAT}$ of 36 volts) or $R_{C1}$=240 kΩ to $R_{C2}$=27 kΩ (at a nominal supply voltage $V_{BAT}$ of 18 volts or 10.8 volts). Preferably, the divider ratio of the third voltage divider 22 corresponds to the divider ratio of the first voltage divider 11. Particularly preferably, the resistors of the first voltage divider 11 and of the third voltage divider 22 are selected such that the following applies: $R_{L1}$=$R_{C1}$ and $R_{L2}$=$R_{C2}$.

When a voltage drop is detected, the control device 12 can provide a control signal 23, wherein the restart protection device 9 selectively blocks or releases the start-up of the electric motor M depending on the control signal 23.

The invention claimed is:

1. A device for detecting a voltage drop between an anode connection and a cathode connection, comprising
   a control capacitor, of which a first electrode is connected to the anode connection via a voltage divider and the second electrode is connected to the cathode connection;

a measuring device, which is designed to output a discharge signal depending on a potential difference detected between the anode connection and the cathode connection, and a first threshold value for the potential difference on a discharge control line;
a discharge circuit, which is connected to the discharge control line and is designed to discharge the control capacitor depending on the discharge signal; and
a control device, which is designed to detect the voltage drop by evaluating the state of charge of the control capacitor;
   wherein the measuring device includes a first control switch having an input connected to the anode connection and wherein the first control switch connects the discharge control line to the cathode connection with low impedance when the input potential applied at the control input exceeds the first threshold value;
   wherein the first control switch is adapted to disconnect the discharge control line from the cathode connection when the input potential applied at the control input drops below the first threshold value;
   wherein the discharge circuit includes a second control switch including a control input connected to the discharge control line and which connects the first electrode of the control capacitor with low impedance to the second electrode of the control capacitor when the discharge control line is disconnected from the cathode connection; and
   wherein the control input of the second control switch is connected to the anode connection via a pull-up resistor.

2. The device according to claim 1, wherein the anode connection or the cathode connection are connectable to corresponding supply terminals of an external voltage source and wherein the external voltage source is one or multiple rechargeable battery packs.

3. The device according to claim 1, wherein the first electrode of the control capacitor is connected to the anode connection of the voltage divider.

4. The device according to claim 1 wherein the first threshold value is 10% to 90% of the nominal potential difference between the anode connection and the cathode connection.

5. The device according to one of claim 1, wherein the first control switch or the second control switch are a semiconductor switch.

6. The device according to claim 1, wherein the control device has a comparator unit adapted to compare the state of charge of the control capacitor with a second threshold value to determine a potential difference between the anode connection and the cathode connection, wherein the voltage drop is detected when the state of charge is lower than the second threshold value.

7. The device according to claim 6, wherein the second threshold value is 1% to 95% of the nominal potential difference between the anode connection and the cathode connection.

8. A battery-operated electrical machine tool, including an anode connection and a cathode connection for electrical supply, and a device for detecting a voltage drop between the anode connection and the cathode connection, the battery-operated machine tool comprising:
   a control capacitor, of which a first electrode is connected to the anode connection via a voltage divider and a second electrode is connected to the cathode connection;

a measuring device, which is designed to output a discharge signal depending on a potential difference detected between the anode connection and the cathode connection, and a first threshold value for the potential difference on a discharge control line;

a discharge circuit, which is connected to the discharge control line and is designed to discharge the control capacitor depending on the discharge signal; and a control device, which is designed to detect the voltage drop by evaluating the state of charge of the control capacitor;

wherein the measuring device includes a first control switch having an input connected to the anode connection and wherein the first control switch connects the discharge control line to the cathode connection with low impedance when the input potential applied at the control input exceeds the first threshold value;

wherein the first control switch is adapted to disconnect the discharge control line from the cathode connection when the input potential applied at the control input drops below the first threshold value; wherein the discharge circuit includes a second control switch including a control input connected to the discharge control line and which connects the first electrode of the control capacitor with low impedance to the second electrode of the control capacitor when the discharge control line is disconnected from the cathode connection; and wherein the control input of the second control switch is connected to the anode connection via a pull-up resistor.

9. The electrical machine tool according to claim 8, further comprising a restart protection device for protection against an uncontrolled restart of the electrical machine tool after a voltage drop, wherein the restart protection device is connected to the device for detecting the voltage drop.

10. A method for detecting a voltage drop between an anode connection and a cathode connection, whereupon the state of charge of a control capacitor is evaluated in order to detect the voltage drop, a first electrode of the control capacitor being connected to the anode connection and a second electrode of the control capacitor being connected to the cathode connection, wherein the control capacitor is discharged depending on a potential difference, which is detected between the anode connection and the cathode connection, and a first threshold value for the potential difference; wherein the method further comprises utilizing a measuring device that includes a first control switch having an input connected to the anode connection and wherein the first control switch connects a discharge control line to the cathode connection with low impedance when the input potential applied at the control input exceeds the first threshold value;

wherein the control switch is adapted to disconnect the discharge control line from the cathode connection when the input potential applied at the control input drops below the first threshold value.

* * * * *